United States Patent [19]

Ikegame et al.

[11] Patent Number: 4,747,450
[45] Date of Patent: May 31, 1988

[54] METHOD FOR PRODUCING HEAT SINK AND HEAT SINK THUS PRODUCED

[75] Inventors: Hiroo Ikegame, Tokyo; Shigeo Nonaka; Takuro Ito, both of Yokohama; Toshiaki Matsumoto, Tokyo, all of Japan

[73] Assignee: Kabushiki Kaisha Toshiba, Kawasaki, Japan

[21] Appl. No.: 908,773

[22] Filed: Sep. 18, 1986

[30] Foreign Application Priority Data

Sep. 18, 1985 [JP] Japan ................. 60-204428

[51] Int. Cl.⁴ .............................. F28F 3/12
[52] U.S. Cl. .................. 165/168; 165/80.4; 357/82
[58] Field of Search ........ 165/80.4, 168, 171; 357/82; 174/152

[56] References Cited

U.S. PATENT DOCUMENTS

| | | | |
|---|---|---|---|
| 665,573 | 1/1901 | Moody et al. | 174/15 R X |
| 1,571,929 | 2/1926 | Bronander | 165/171 X |
| 1,847,573 | 3/1932 | Rupp | 165/171 |
| 2,506,118 | 5/1950 | Taylor | 165/168 X |
| 3,213,929 | 10/1965 | Marshall et al. | 174/15 R X |
| 3,711,681 | 1/1973 | Leuschner et al. | 165/168 X |
| 3,848,665 | 11/1974 | Uerlichs et al. | 165/168 |
| 4,010,489 | 3/1977 | Bourbeau et al. | 357/82 |
| 4,287,724 | 9/1981 | Clark | 165/168 X |
| 4,602,674 | 7/1986 | Eriksson | 165/168 X |

FOREIGN PATENT DOCUMENTS

| | | |
|---|---|---|
| 1514679 | 6/1969 | Fed. Rep. of Germany . |
| 3039693 | 4/1982 | Fed. Rep. of Germany ...... 165/168 |
| 3,114,556 | 9/1982 | Fed. Rep. of Germany ..... 165/80.4 |
| 3411523 | 10/1984 | Fed. Rep. of Germany . |
| 88813 | 3/1967 | France . |
| 2524760 | 10/1983 | France . |
| 60-113448 | 6/1985 | Japan . |

OTHER PUBLICATIONS

R. G. Christensen, IBM Technical Disclosure Bulletin, "Water-Cooled Heat Transfer Plate", vol. 23, No. 4, (09/80), p. 1445.

*Primary Examiner*—Ira S. Lazarus
*Assistant Examiner*—Richard R. Cole
*Attorney, Agent, or Firm*—Foley & Lardner, Schwartz, Jeffery, Schwaab, Mack, Blumenthal & Evans

[57] ABSTRACT

In a heat sink for semiconductor elements and the like, a pipe made of a heat-conductive material such as copper, aluminum and the like is bent at a middle portion thereof and wound such that a forward flow passage and a return flow passage for a liquid coolant are both formed into a spiral shape with the bent portion held at the center of the spiral.

16 Claims, 5 Drawing Sheets

METHOD FOR PRODUCING HEAT SINK AND HEAT SINK THUS PRODUCED

BACKGROUND OF THE INVENTION

This invention relates to a method for producing a cooling member and a cooling member produced by the method.

According to the recent progress in the field of semiconductor technique, semiconductor elements of a large capacity operable at 4000V–3000A or more one triggered directly with light signal have been developed and are used practically. In such a semiconductor element, since several kW of heat is generated in a small area of the electrodes of the semiconductor element, a cooling device of an extremely large capability is required.

In order to satisfy such a requirement, heretofore has been proposed a heat sink made of a highly heat-conductive metal such as copper or aluminum, through which a circulation passage of a liquid coolant is provided in a zigzag form. In a typical application, a required number of the heat sinks are placed between semiconductor elements such as diodes, thyristors, gate turn off (GTO) thyristors and the like, respectively, and the coolant passages formed in the heat sinks are connected together through a member of coolant supplying pipes made of an electrically insulating material so as to provide a coolant circulating path. By circulating a liquid coolant such as water through the coolant circulating path by means of a coolant circulating pump provided in the path, the heat generated in the semiconductor elements is transferred to the coolant and carried outside of the semiconductor elements.

In the aforementioned heat sink, however, the thickness of the heat sink becomes comparatively thick not only because of the heat-conductive metal member through which the zigzag formed circulation passage is provided, but also because of the zigzag-formed configuration, the head loss caused when the liquid coolant flows through the circulation passage in each heat sink becomes high, thus requiring a large capacity of the pump for circulating the liquid coolant therethrough. Furthermore, the temperature of the liquid coolant becomes much different between the inlet portion and outlet portion of the coolant passage in each heat sink, which entails a difficulty of increasing the thermal stress in the semiconductor element and requiring a heat exchanger of a large capacity in the coolant circulating path.

SUMMARY OF THE INVENTION

An object of this invention is to provide a heat sink for cooling stacked means such as semiconductor elements, and a method for producing the heat sink wherein the disadvantages of the conventional technique can be substantially eliminated.

Another object of the invention is to provide a heat sink and a method for producing the same, which are simple and economical, and capable of eliminating the possibiity of leakage.

Still another object of the invention is to provide a heat sink, the thickness of which is substantially reduced while the operational characteristics thereof are improved remarkably.

These and other objects of the invention can be achieved by a method for producing a heat sink comprising the steps of preparing a pipe made of a heat conductive material, bending the pipe at a middle portion thereof into a loop form such that two portions of the pipe provided on both sides of the middle portion extend side by side in one direction from the bent middle portion, and winding the thus bent pipe into a spiral shape with the bent middle portion held at the center, and both the side portions of the pipe formed into a forward flow passage and a return flow passage for a liquid coolant circulating through the heat sink thus produced.

According to the present invention, in another aspect thereof, there is provided a heat sink for cooling stacked means consisting of a pipe made of a heat conductive material, comprising a forward flow passage for a liquid coolant, a return flow passage for the liquid coolant, and a middle portion provided between the forward flow passage and the return flow passage, the middle portion being bent and wound so that the forward and return flow passages are formed into spirals starting from the middle portion.

Preferably, the pipe is constructed to provide a rectangular cross-section, and the forward flow passage and return flow passage are formed by two side portions of the pipe which are wound side by side into the spiral shape.

DESCRIPTION OF THE PREFERRED EMBODIMENT

Before entering the description of this invention, a conventional construction of a heat sink will be described in more detail with reference to FIGS. 1 and 2.

Figure 1:
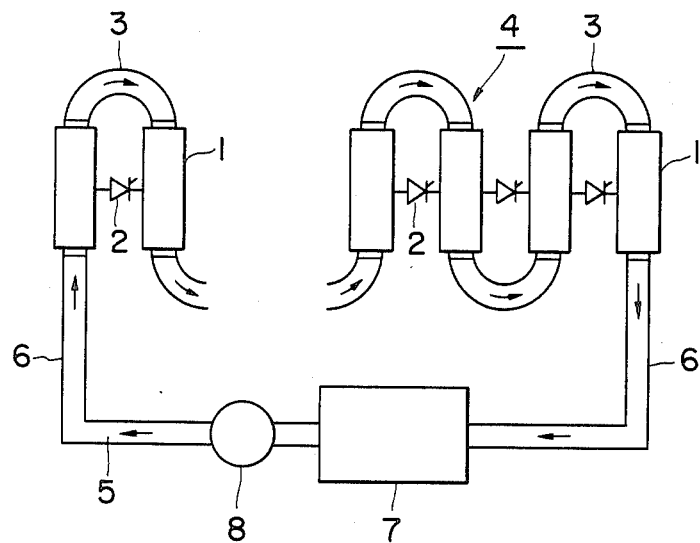
FIG. 1 is a diagram showing an ordinary arrangement of heat sinks for cooling semiconductor elements.

In its application, a number of heat sinks 1 of a liquid cooled type are ordinarily piled up in the form of a stack 4, each pad being interposed between two adjacent semiconductor elements 2 of a flat shape, such as diodes, thyristors, GTOs and the like as shown in FIG. 1, and compressed together under application of a pressure of several tons. The heat sinks 1 are interconnected by a number of pipes 3 made of an insulating material. A liquid coolant 5 such as water is supplied through main pipes 6 also made of an insulating material under the action of a pump 8, and the heat in the circulated coolant is exchanged by a heat exchanger 7 provided in the circulation passage of the liquid coolant.

Each of the heat sinks 1 in the above described arrangement comprises a block of a heat-conductive material such as copper or aluminum, with a coolant passage 9 of an undulated configuration form through the block. The liquid coolant 5 flows in and out of the coolant passage 9 of each pad 1 through inlet and outlet ports 10 provided at the ends of the passage 9.

Figure 2:
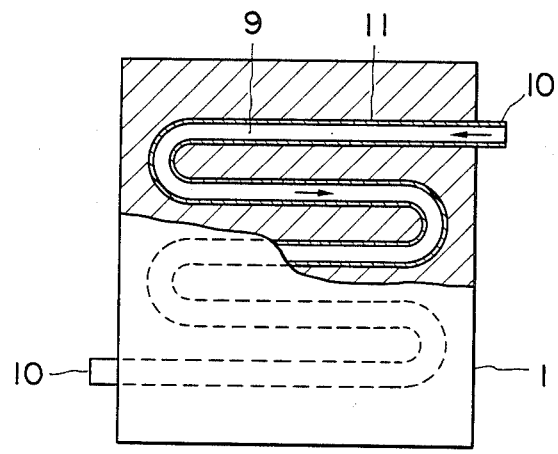
FIG. 2 is a modification of the conventional construction of the heat sink.

The aforementioned passage 9 may otherwise be formed by use of a tube 11 made of copper or aluminum, which is undulated and casted in the block as shown in FIG. 2.

Regardless of the way of construction of the heat sink 1, the undulated passage 9 provides a long length and increases the heat-exchanging surface area of the heat sink 1. However, an increase in the number of bending portions and steepening of the curvature increases the head loss of liquid coolatn 5, and increases the required capacity of the circulation pump 8. Furthermore, since the passage 9 is simply undulated without duplication or else, the temperature of the coolant passing through the passage 9 is low at the inlet portion and high at the outlet portion of the passage 9. Such a temperature difference in a single pad creates a thermal stress in the semiconductor element 2 contacting the heat sink 1. For eliminating such a disadvantage, the capacity of the heat exchanger 7 must be increased, which in turn increases the size of semiconductor apparatus cooled by the heat sinks.

Figure 3:
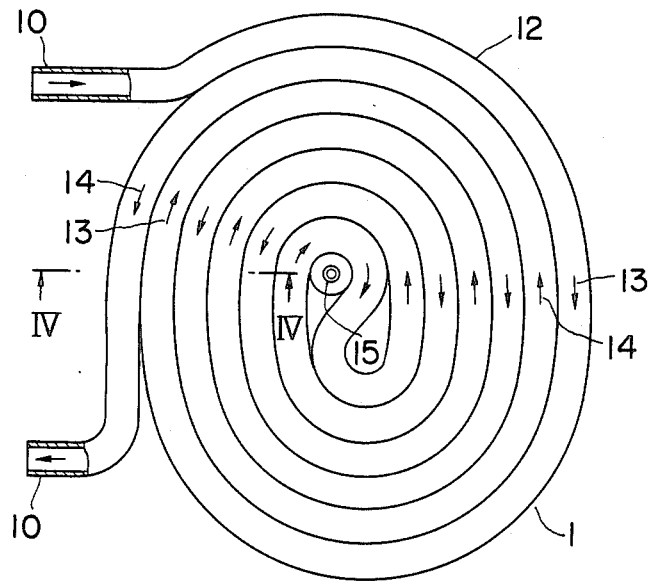
FIG. 3 is a plan view showing a heat sink according to a preferred embodiment of this invention.

In order to overcome the above described difficulties of the conventional construction, a heat sink 1 according to a preferred embodiment of this invention, as shown in FIG. 3, comprises solely a cooling pipe 12 made of a heat conductive material such as copper or aluminum without using the block of the conventional construction.

The cooling pipe 12 is bent in a middle part thereof into a loop form so that both the side portions of the pipe 12 excepting the middle part are brought together to be extended side by side in one direction from the bent middle part of the pipe 12. The pipe 12 thus bent is then wound into a spiral with the bent middle part held at the center and both the side portions of the pipe 12 held in a closely contacting relation with each other, thereby providing a heat sink as shown in FIG. 3. In this heat sink 1, a liquid coolant 5 such as water is passed through a forward flow passage 13 formed by one of the two side portions of the pipe toward a central portion 15 of the spiral, and then through a return flow passage 14 formed by the other of the two side portions of the pipe toward a periphery of the spiral.

Figure 4:
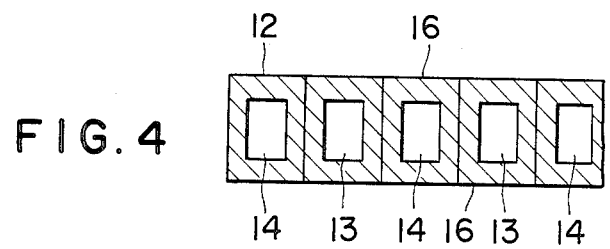
FIG. 4 is a sectional view taken along the line IV—IV in FIG. 3.

In this construction, the pipe 12 is preferably formed into a rectangular cross-sectional configuration as shown in FIG. 4, while the number of turns of the spiral wound pipe 12 may be selected as desired according to the required diameter of the heat sink 1. Likewise, the positions of coolant introducing and delivering ports 10 formed at the ends of the passages 13 and 14, respectively, may be selected as desired.

Although a small void is formed at the center of the spiral for inserting a jig or the like at the time when the pipe 12 is subjected to bending and winding processes, such a void is preferably filled with a heatconductive material similar to that used for producing the pipe 12. Since the pipe 12 is provided with a rectangular cross-section, a final machining of, for instance, 0.5 mm depth is sufficient for obtaining smooth surfaces 16 to be brought into contact with the semiconductor elements 2 on both surfaces of the heat sink 1.

The liquid coolant 5 such as water supplied in the inlet port 10 flows through the forward flow passage 13 toward the central portion 15 of the heat sink 1, and then from the central portion 15 through the return flow passage 14 and the outlet port 10 to outside of the heat sink 1. Since the pipe 12 of the pad 1 is wound into a spiral form, and the electrodes of the semiconductor elements 2 are brought into direct contact with the pipe 12, the cooling effect of the heat sink 1 can be improved remarkably. Furthermore, since the forward flow passage 13 and the return flow passage 14 are disposed alternately, the temperature of the heat sink is distributed evenly, and the creation of the thermal stress in the semiconductor element can be substantially eliminated. In addition, since the number of the bending portions is reduced, the head loss in the passages of the heat sink 1 can be reduced, and hence the required capacity of the circulation pump 8 can be reduced. The improved cooling effect of the heat sink also reduces the capacity of the heat exchanger 9 so that the size of the semiconductor apparatus can be minimized.

However, the heat sink 1 according to this invention is ordinarily subjected to a high compressive force when it is stacked together between semiconductor elements, and hence a sufficient amount of wall thickness is required for withstanding the compressive force.

For instance, in case of producing a heat sink having a cooling surface 16 of approximately 100 mm diameter, compressive force of about 10 tons is applied to the pad, and hence a wall thickness of 4~5 mm is required for the cooling pipe 12 forming the heat sink 1.

FIG. 4 is a sectional view taken along the line IV—IV in FIG. 3. Since the cooling pipe 12 used for providing the heat sink 1 of this embodiment, which is preferably formed into a rectangular cross-section, has a wall thickness equal in both directions, parallel and perpendicular to the surfaces 16 contacting with semiconductor elements as shown in FIG. 4, the heat conductivity of this embodiment cannot be sufficiently good.

Figure 5:
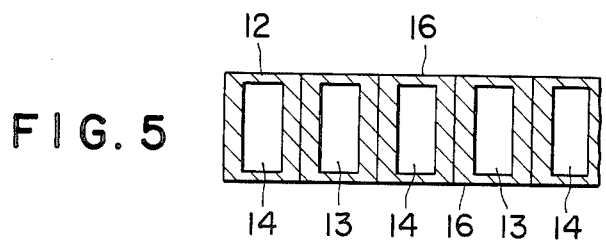
FIG. 5 is a sectional view similar to FIG. 4, which constitutes a portion of another embodiment of this invention.

According to another embodiment of this invention, the wall-thickness of the cooling pipe 12 used in the heat sink 1 is made different between the two directions. That is, the thickness of the wall of the pipe 12 extending in parallel with the contacting surfaces 16 is selected to be less than that extending perpendicular to the contacting surfaces 16 as shown in FIG. 5. As a consequence, the heat conductivity of this embodiment can be substantially improved. Furthermore, since the thickness of the wall of the pipe 12 extending in parallel with contacting surfaces 16 is reduced, bending and winding of the pipe 12 can be substantially facilitated, and hence the productivity of the heat sink can be improved. Since the cross-sectional area of the internal bore of the pipe 12 can be increased in accordance with the reduced thickness of the wall, the head loss of the heat sink 1, and hence the required capacity of the circulation pump 8 (see FIG. 1) can be reduced.

Figure 6:
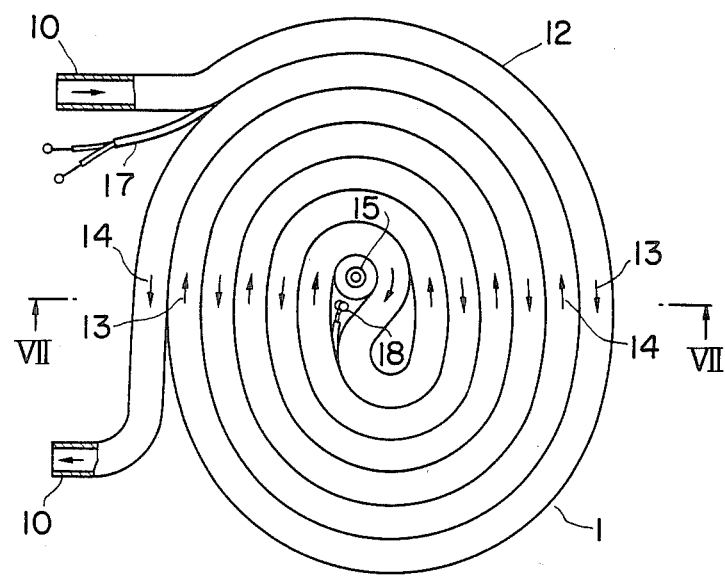
FIG. 6 is a plan view of a heat sink which constitutes still another embodiment of this invention.
Figure 7:
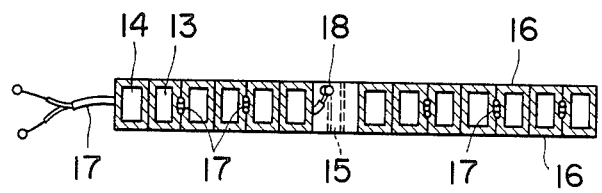
FIG. 7 is a sectional view taken along the line VII—VII in FIG. 6.

FIGS. 6 and 7 illustrate still another embodiment of this invention, wherein a thermocouple element 18 is provided in a central portion of the heat sink 1.

According to this embodiment, the thermocouple element 18 is placed at a suitable position in a small void formed at the center of the spiral wound heat sink 1, and lead wires connected to the thermocouple element 18 are extended to be inserted between the portions of the pipe 12, forming the forward and return flow passages 13 and 14, during the pipe winding stage of the heat sink production. The remaining part of the small void is completely filled with a heat conductive material similar to that forming the cooling pipe 12, and then the heat sink 1 thus produced is slightly machined to provide smooth surfaces 16 contacting with the semiconductor elements. In order to prevent the thermocouple element 18 from being damaged mechanically and thermally, a protection member made of a synthetic resin may be provided around the thermocouple element. In case where a thick insulation is required for the lead wires 17 due to a high voltage of the semiconductor elements, a recess or groove of a suitable size may be provided in the walls of the pipe portions between which the lead wires 17 are inserted.

Since the lead wires 17 are extended between the spirally wound portions of the pipe 12, there is no necessity of forming a groove in a contacting surface of the pad 1 for accommodating the lead wires 17, and the cooling efficiency of the heat sink 1 can be improved in comparison with a type of heat sink having such a groove in the contacting surface thereof. Since the lead wires 17 are extended between the wound portions of the pipe 12 having a square or rectangular cross-section, there is no possibility of displacing the thermocouple 18 even in a case where the lead wires 17 are pulled during the production of the heat sink 1, and the reliability in the operation of the thermocouple can be improved without increasing the production cost.

Figure 10:
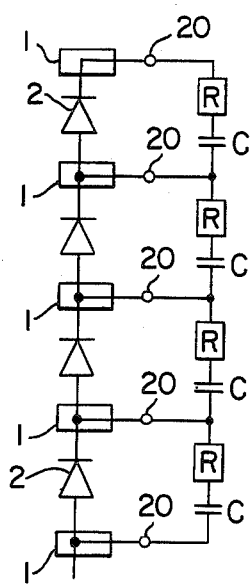
FIG. 10 is a diagram showing a semiconductor circuit wherein the heat sink shown in FIG. 8 is advantageously used for its connection.

Furthermore, when heat sinks are stacked together with the semiconductor elements and the like for cooling the elements and when terminals 20 are provided for connecting the anode side and cathode side of each semiconductor element to a series connection of a resistor and a capacitor as shown in FIG. 10, in case of the conventional construction of the heat sink as shown in FIG. 3, for instance, a machine screw has been driven into the block of copper or aluminum through which the cooling pipe has been provided. Such a procedure of providing terminals 20 cannot be applied to the present invention where the heat sink 1 is made solely of a cooling pipe 12.

Figure 8:
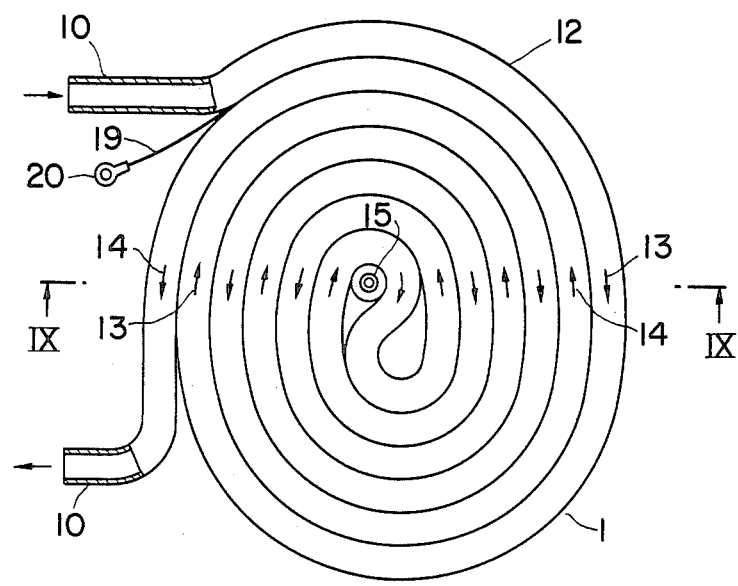
FIG. 8 is a plan view showing still another embodiment wherein the heat sink is otherwise used for electrical connection.
Figure 9:
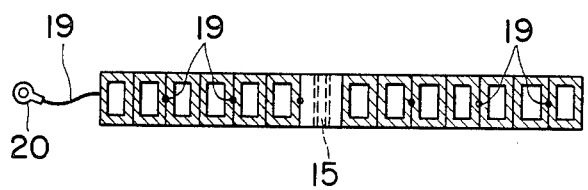
FIG. 9 is a sectional view taken along the line IX—IX in FIG. 8.

FIGS. 8 and 9 illustrate still another embodiment of this invention wherein such terminals 20 are provided without requiring the machine screw and the like.

In the illustrated embodiment, a bare copper or aluminum wire 19 is inserted between the wound portions of the cooling pipe 12 made of a heat and electric conductive material, and a terminal 20 is secured to an outer end of the bare wire 19. The terminals 20 of the heat sinks inserted between the semiconductor elements can be used for connecting the anode side and cathode side of each element to the series connected resistor and capacitor as shown in FIG. 10.

Figure 12:
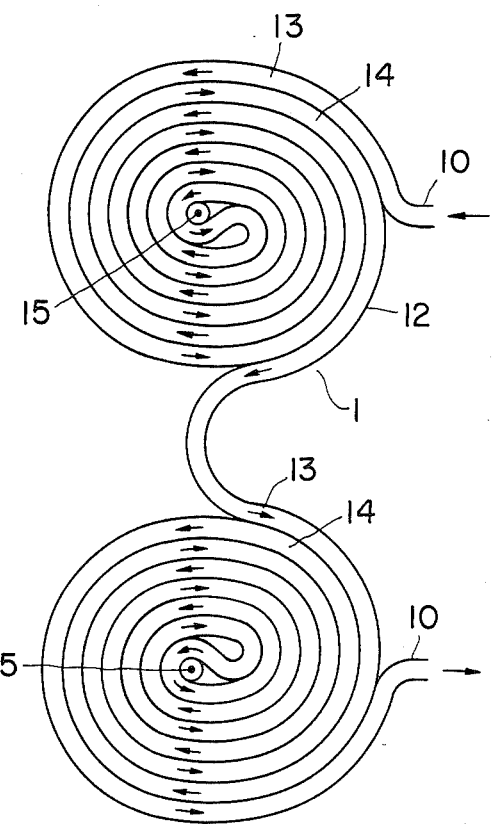
FIG. 12 is a plan view of a duplicated heat sink constituting a further embodiment of the present invention.

FIG. 12 illustrates a further embodiment of the invention wherein two heat sinks 1, each constructed as in the case of the above described embodiment, are connected with each other.

Figure 11:
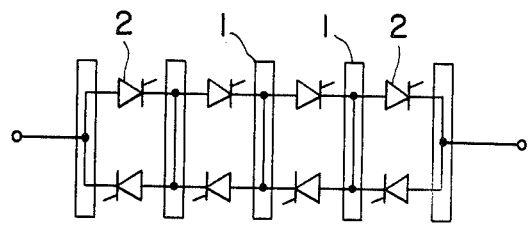
FIG. 11 is a diagram showing a semiconductor circuit wherein a heat sink as shown in FIG. 12 is advantageously used for cooling semiconductor elements.

In a case where the combined circuit of the semiconductor elements 2 is used for a switching purpose, the semiconductor elements 2 are frequently connected in an anti-parallel manner as shown in FIG. 11. In such a case, the embodiment shown in FIG. 12 may be used advantageously in consideration of the electric potential of each element, and since the number of connecting points is reduced, the possibility of leakage of the liquid coolant can be thereby reduced.

According to this invention, there is provided a heat sink for semiconductor elements and the like, which can reduce the thermal stress created in the element and the head loss caused in the heat sink. Furthermore, the thickness of the heat sink is reduced in comparison with the conventional heat sink because the block of heat conducting material through which a cooling passage is formed is not utilized, while the number of the spiral wound turns of the cooling pipe can be varied in accordance with the required diameter of the semiconductor element, and a heat sink of a high cooling effect, high reliability and highly economical in production can be thereby produced.

What is claimed is:

1. A stacked assembly comprising electrical elements and heat sinks, said elements and heat sinks being disposed alternately in side-by-side relationship and being pressed together to form a rigid structure wherein each of the electrical elements is interposed between two adjacent heat sinks to be cooled thereby, each of said heat sinks being made of a prefabricated pipe of a heat conductive material in which a liquid coolant is caused to flow, said pipe comprising, in integrally continuing relation a forward flow pipe portion, a return flow pipe portion and a middle pipe portion connected said forward and return flow pipe portions, said middle pipe portion being bent in such a manner that the forward and return flow pipe portions extend in parallel, mutually contacting relationship, said forward and return flow pipe portions being so wound around the middle pipe portion so as to form coplanar spirals, thereby establishing a heat transferring relationship between adjoining surfaces of the forward and return flow pipe portions.

2. The assembly according to claim 1 wherein said pipe has a rectangular cross-section to provide a pair of opposite planar side surfaces, the adjoining side surfaces of the forward and return flow pipe portions being in planar face-to-face contact.

3. The assembly according to claim 2 wherein said pipe is formed such that the thickness of the walls of said pipe extending perpendicular to the general plane of said coplanar spirals of the heat sink is greater than that of walls extending in parallel with the general plane.

4. The assembly according to claim 1 wherein said electrical elements are semiconductor elements.

5. The assembly according to claim 1 wherein said middle pipe portion is bent in the shape of a loop having a predetermined radius of curvature, thereby to form a void portion at the center of the heat sink.

6. The assembly according to claim 5, further comprising a thermocouple element provided in said void portion, the thermocouple element having a lead wire connected thereto that is inserted between the forward and return flow pipe portions.

7. The assembly according to claim 1, further comprising a bare metal wire inserted between said forward and return flow pipe portions for providing electrical terminals for the assembly.

8. A heat sink for cooling an object, said heat sink comprising: a prefabricated pipe of a heat conductive material in which a liquid coolant for cooling the object is caused to flow, said pipe including, in integrally continuing relation, a forward flow pipe portion, a return flow pipe portion and a middle pipe portion connecting said forward and return flow pipe portions, said middle pipe portion being bent in such a manner that the forward and return flow pipe portions extend in parallel, mutually contacting relationship, said forward and return flow pipe portions being so wound around the middle pipe portion so as to form spirals thereby establishing a heat transferring relationship between adjoining surfaces of the forward and return flow pipe portions.

9. The heat sink according to claim 8 wherein said pipe has a rectangular cross-section to provide a pair of opposite planar side surfaces, the adjoining side surfaces of the forward and return flow pipe portions being in planar face-to-face contact.

10. The heat sink according to claim 9 wherein said pipe is formed such that the thickness of walls of said pipe extending perpendicular to the general plane of said coplanar spirals of the heat sink is greater than that of walls extending in parallel with the general plane.

11. The heat sink according to claim 8 wherein said object is a semiconductor element.

12. The heat sink according to claim 8 wherein said middle pipe portion is being in the shape of a loop having a predetermined radius of curvature, thereby to form a void portion at the center of the heat sink.

13. The heat sink according to claim 12, further comprising a thermocouple element provided in said void portion, the thermocouple element having lead wire connected thereto and extended to be inserted between the forward and return flow pipe portions.

14. The heat sink according to claim 8, further comprising a bare metal wire inserted between said forward and return flow pipe portions.

15. A heat sink for cooling stacked elements, said heat sink comprising: a pipe made of a heat conductive material, including a forward flow passage for a liquid coolant, a return flow passage for the liquid coolant, a middle portion formed between said forward flow passage and said return flow passage, said middle portion being bent to form a void portion at the center of the heat sink and wound so that said forward and return flow passages are formed into mutually contacting spirals starting from said middle portion, and a thermocouple element provided in said void portion, said thermocouple element having lead wires connected thereto and inserted between said forward and return flow portions.

16. A heat sink assembly for cooling stacked elements, said heat sink assembly comprising a pair of heat sinks combined to be arranged side by side in a plane and connected together in series, each of said heat sinks being made of a pipe of a heat conductive material, each of said heat sinks comprising a forward flow passage for a liquid coolant. a return flow passage, said middle portion being bent and wound so that said forward and return flow passages are formed into spirals starting from said middle portion.

* * * * *